United States Patent [19]

Eltoukhy

[11] Patent Number: 4,816,127
[45] Date of Patent: * Mar. 28, 1989

[54] METHOD OF PRODUCING THIN-FILM STORAGE DISK

[75] Inventor: Atef Eltoukhy, San Jose, Calif.

[73] Assignee: Xidex Corporation, Fremont, Calif.

[*] Notice: The portion of the term of this patent subsequent to Aug. 5, 2003 has been disclaimed.

[21] Appl. No.: 814,229

[22] Filed: Dec. 27, 1985

Related U.S. Application Data

[63] Continuation-in-part of Ser. No. 672,595, Nov. 15, 1984, abandoned, and a continuation-in-part of Ser. No. 706,737, Feb. 28, 1985, Pat. No. 4,604,179.

[51] Int. Cl.⁴ .............................................. C23C 14/34
[52] U.S. Cl. ............................ 204/192.15; 204/192.2
[58] Field of Search .......... 204/192 R, 192 M, 192 C, 204/298, 192.15, 192.2; 360/135; 428/64, 209, 216, 667, 668, 900, 928

[56] References Cited

U.S. PATENT DOCUMENTS

| | | | |
|---|---|---|---|
| 3,192,892 | 7/1965 | Hanson et al. | 204/192 M |
| 3,303,116 | 2/1967 | Maissel et al. | 204/192 M |
| 4,079,169 | 3/1978 | Nigh et al. | 428/636 |
| 4,236,946 | 12/1980 | Aboaf et al. | 204/19 M X |
| 4,277,540 | 7/1981 | Ain | 204/627 |
| 4,392,931 | 7/1983 | Maniv et al. | 204/298 X |
| 4,472,259 | 9/1984 | Class et al. | 204/298 |
| 4,537,832 | 8/1985 | Kohmoto et al. | 204/192 M X |
| 4,552,820 | 11/1985 | Lin et al. | 204/192 M |

FOREIGN PATENT DOCUMENTS 55-172382 5/1980 Japan.
56-87664 2/1981 Japan.

OTHER PUBLICATIONS

Ahn, K. Y. et al., IBM Technical Disclosure 21(10) 4232 (1979).
Simpson, E. M. et al., IEEE, B-P-28:148 (1984).

Primary Examiner—John F. Niebling
Assistant Examiner—Nam X. Nguyen
Attorney, Agent, or Firm—Peter J. Dehlinger

[57] ABSTRACT

A method of producing a thin-film magnetic disk having high coercivity and magnetic remanence, good loop squareness, and low fluctuation in peak-to-peak recording signal amplitude over an entire circular recording path. The novel aspects of the method which contribute to the performance characteristics of the disk are (a) layering a 300–1,000 Å magnetic film containing between about 70–88% cobalt, 10–28% nickel, and 2–12% chromium over a 1,000–4,000 Å chromium underlayer; (b) forming the film and underlayer under sputtering disposition conditions which prevent low-angle asymmetrical sputtering; and (c) shielding the disk substrate during sputtering in a manner which produces substantially uniform-thickness deposition.

4 Claims, 4 Drawing Sheets

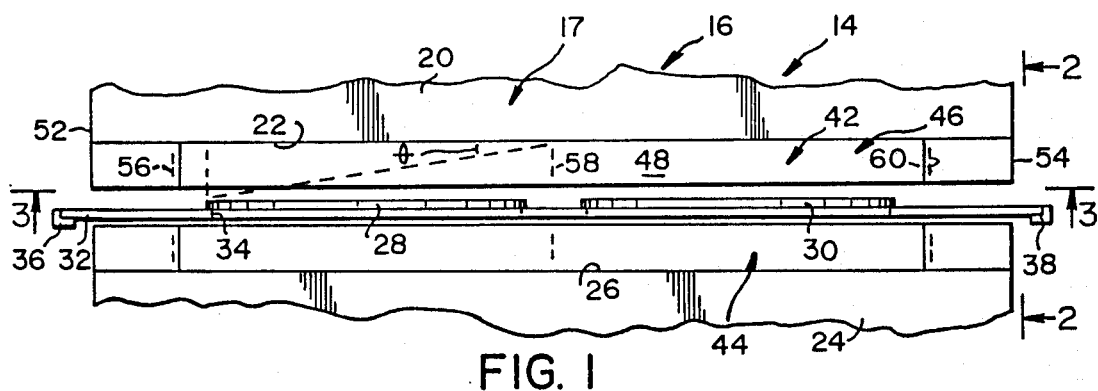
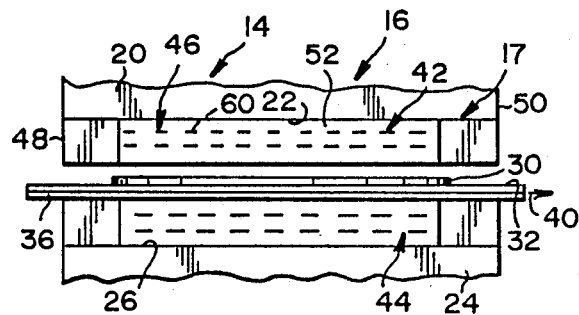 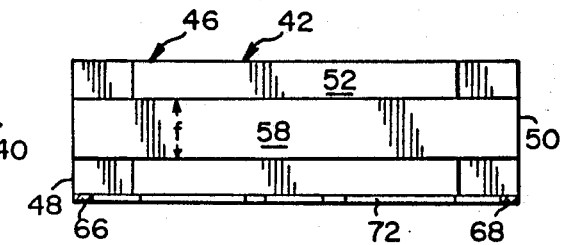
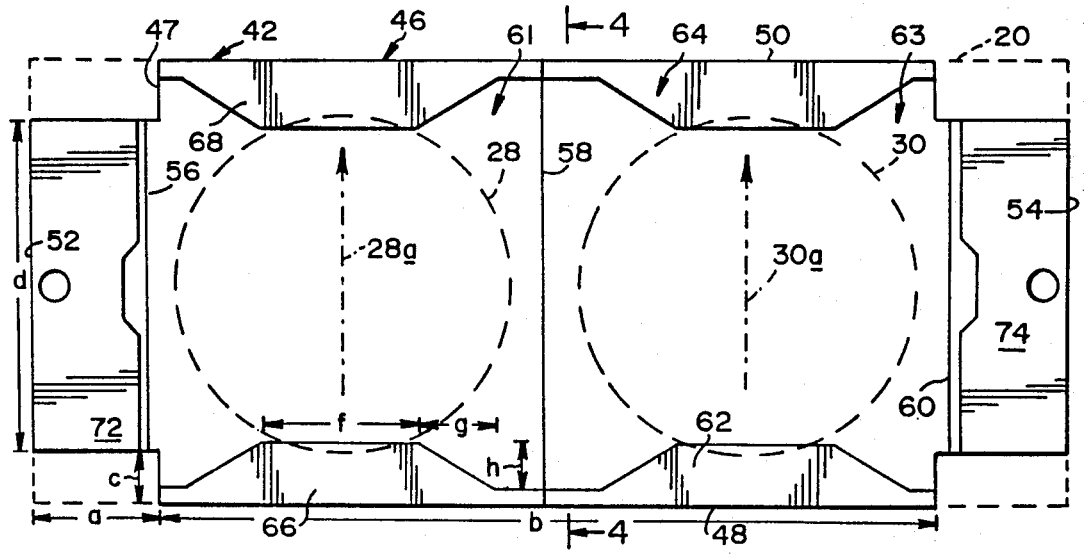

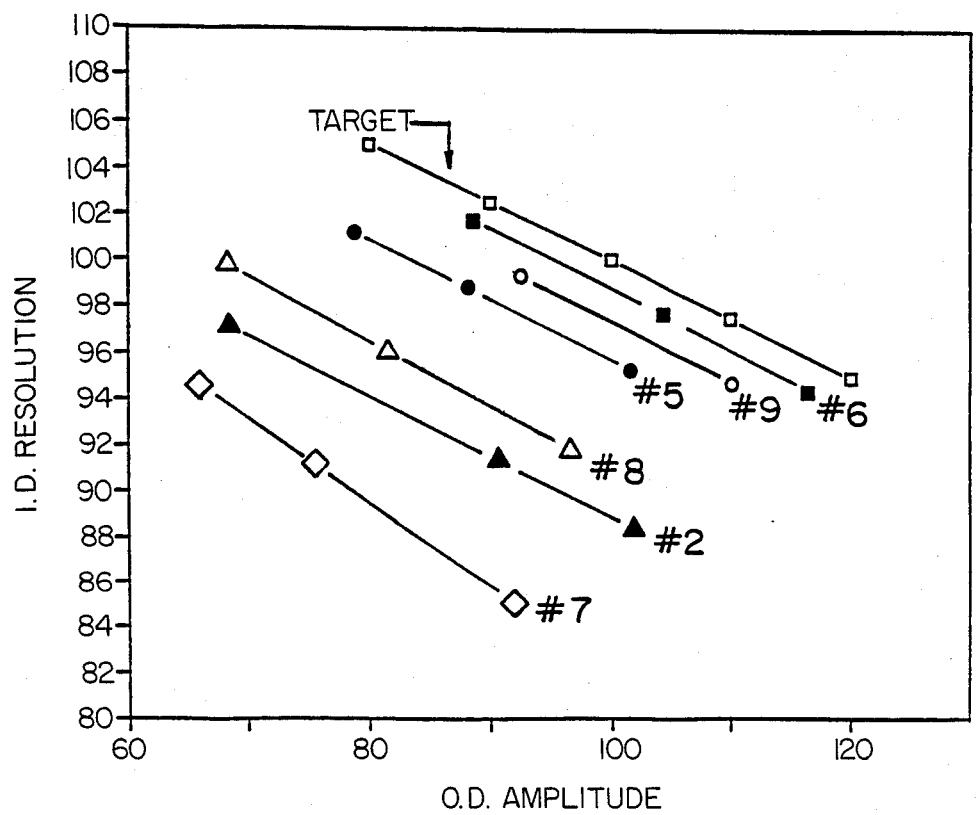

METHOD OF PRODUCING THIN-FILM STORAGE DISK

This application is a continuation-in-part of U.S. patent application Ser. No. 672,595, for "Thin-Film Storage Disk", filed Nov. 15, 1984, now abandoned, and a continuation-in-part of U.S. patent application Ser. No. 706,737, for "Sputtering System Baffle and Method", filed Feb. 28, 1985 now U.S. Pat. No. 4,604,179.

FIELD OF THE INVENTION

The present invention relates to magnetic recording media, and particularly to a method of producing a thin-film magnetic recording media having high performance characteristics.

BACKGROUND OF THE INVENTION

When a magnetic material, e.g., the magnetic film of a recording disk, is placed in a magnetic field H, a magnetic flux M is induced in the material. (For purposes of background explanation, reference is made to the M-H hysteresis loop which is shown in FIG. 9.) The loop closure points in an M-H hysteresis loop (such as the one illustrated in FIG. 9 herein) define the positive and negative magnetic field values $H_s$ at which reflux saturation occurs. If the field is varied from $H_s$ to zero, the material retains a characteristic flux density $M_r$, or remanence, which measures the ability of the material or hold magnetic flux in the absence of an external magnetic field. Operationally, remanence determines the signal amplitude which can be read from an isolated pulse stored in the medium—the greater the remanence, the greater the signal amplitude which can be detected in a reading operation.

A second important property of a recording medium is its intrinsic coercivity $H_c$, defined as the magnetic field required to reduce the remanence magnetic flux to 0, i.e., the field required to erase a stored information bit in the medium. With reference to FIG. 9, H is defined as the measured magnetic field at M=0. It can be appreciated that higher coercivity in a medium allows adjacent recorded bits to be place more closely together without mutual cancellation. Accordingly, higher coercivity in a magnetic medium is associated with higher information storage density.

Other important magnetic properties are loop squareness, and the ratio of coercivity to saturation field, i.e., $H_c/H_s$. As can be appreciated with reference to FIG. 9, as $H_s$ becomes smaller (approaches $H_c$), it takes less field strength to switch or "write" the medium. In practical terms, this means that when a new signal is written over an old signal, the ratio of old signal residual to new signal is relatively small. This ratio is also referred to as overwrite, a small overwrite ratio including good writability. In summary, high remanence and coercivity and high hysteresis-loop squareness contribute importantly to signal strength, storage density, and overwrite characteristics in a magnetic recording medium.

Considerable effort has been devoted in the prior art to the preduction of magnetic recording media having the desired properties discussed above. One method which has received increasing attention involves vapor deosition of an ion-bombarded target metal, or sputtering onto a substrate. In the usual sputtering system, a pair of disk-like substrates, carried in a side-by-side arrangement on a pallet, is moved through a succession of sputtering stations, in a front-to-back direction, to produce one or more underlayers, an outer magnetic thin film, and a protective coating. The overall method provides efficient, high throughput production of multilayered thin-film media.

Despite these advantages, sputtering systems of the type mentioned above have not been entirely satisfactory, in that the sputtered layer may show significant crystal anisotropy and/or variations in layer thickness. Both types of surfaces nonuniformities lead to angular variations in magnetic signal properties, particularly at outer-track regions of a magnetic disk. As will be seen below, signal-amplitude variations of up to about 25%, as measured at an inner-diameter recording track, and up to about 40%, as measured at an outer-diameter recording track, are typical in magnetic recording disks formed in sputtering systems of the type described above.

In theory, it should be possible to eliminate crystal anisotropy and variations in film thickness in a sputtering operation by rotating the substrates as they pass through each of the sputtering stations. However, it would be relatively difficult and expensive to adapt existing types of sputtering systems to provide simultaneous linear and rotational substrate movement through the various sputtering stations. An alternative approach which is compatible with the design of existing commercial sputtering machines would be to partition each sputtering target into a number of smaller target regions by placing multiple shields or baffles between the target and the region where deposition occurs. These baffles would act to prevent all but direct, high-angle deposition from the target onto the substrate. A number of baffle configurations, including a multi-web lattice or a plurality or relatively close-packed cylinders, would be suitable. Although this approach would result in a sputtered layer having an isotropic crystal structure and relatively uniform thickness, the time and amount of target material needed to form the layer would be relatively great, since a major portion of the sputtered material would be deposited on the walls of the baffles. Maintenance problems relative to removing deposited material from the baffles regularly would be considerable, as well.

SUMMARY OF THE INVENTION

It is therefore a general object of the invention to provide a method for forming, in a high throughput sputtering system of the type described above, a thin-film magnetic recording disk or medium having high performance characteristics related to high coercivity and remanence, and good loop squareness, and which gives fluctuations in peak-to-peak recording signal amplitude, over an entire circular recording path, of no more than about 15%.

Another object of the invention is to provide such a method which is highly efficient, in terms of deposition material and rate of deposition of sputtered material.

A relatied object of the invention is to provide such a method for producing high-performance recording media in an automated highly reproducible manner.

The method is directed specifically to producing a thin-film magnetic disk having a coercivity of about 700 Å, a magnetic squareness ratio of at least $3 \times 10\text{-}3$ EMU/cm$^2$, a loop squareness ratio of at least about 0.85, and characterized by fluctuations in peak-to-peak recording signal amplitude, over an entire circular path, of no more than about 15%. In practicing the invention, a disk is placed on a pallet for movement, linearly and without rotation, through a sputtering apparatus having a first target adapted to sputter a chromium underlay onto the substrate, and a second, or downstream, target adpated to sputter onto the underlayer an alloy containing between about 70–86% cobalt, 10–28% nickel, and 2–12% chromium.

The pallet is first moved into an upstream deposition region underlying an upstream portion of the first target, during which the substrate is shielded to limit deposition of sputtered material substantially to (a) substrate regions which directly underlie the target and (b) target side regions which are substantially symmetrical with respect to the center-line path of travel of the substrate. The deposition of sputtered material in the upstream deposition region is effective to produce a coalesced crystal layer, at least about 200 Å thick, whose crystal orientation directions are substantially isotropic. The target is then moved into a downstream deposition region underlying a downstream portion of the first target, where sputtering takes place under conditions which substantially preserve the crystal isotropy of the coalesced crystal layer, and which produce a final chromium underlayer thickness of between about 1000 and 4000 Å.

The substrate is now moved into and through a film deposition region underlying the second target, in which the alloy is sputtered onto the isotropic underlayer at sputtering angles which substantially preserve the crystal isotropy of the underlayer. The substrate is also shielded from the second target in a manner which provides progressively less shielding between the second target and substrate, on moving outwardly away from the center-line path of substrate travel, toward opposite side regions of the substrate, to produce a substantially uniform-thickness alloy film which has a final selected film thickness of between 300–1,000 Å.

In a preferred embodiment of the invention, the substrate is shielded from the first target by a baffle having front and back shields which limit deposition onto the substrate predonimantly to substrate regions which directly underlie the target, and a pair of baffle strips (a) positioned on either side of the substrate with such in the front deposition region, to effect substantially symmetrical, unhindered side-to-side sputtering, and (b) extending between the two shields in a generally front-to-back direction. A similar type of baffle having front and back shields, and a pair of front-to-back strips extending therebetween is preferably used to shield the substrate from the second target. The shielding which effects uniform-thickness deposition in the film deposition region is preferably a projection having side edges which are tapered inwardly on progressing away from front or back baffle shields.

These and other objects of the present invention will become more fully apparent when the following detailed description of the invention is read in conjunction with the accompanying drawings.

BRIEF DESCRIPTION OF THE DRAWINGS

FIG. 1 is a front-on view of a sputtering station in a system employing baffles constructed station in a system employing baffles constructed according to the invention;

FIG. 2 shows the sputtering station of FIG. 1, as viewed from the side, along line 2—2 in FIG. 1;

FIG. 3 is a plan view of a baffle constructed according to one embodiment of the invention;

FIG. 4 is a sectional view of the baffle, taken generally along the line 4-4 in FIG. 3;

FIG. 11 shows the comparison of the amplitude/resolution characteristics of a number of commercially available media, including the instant disk.

Figure 5:
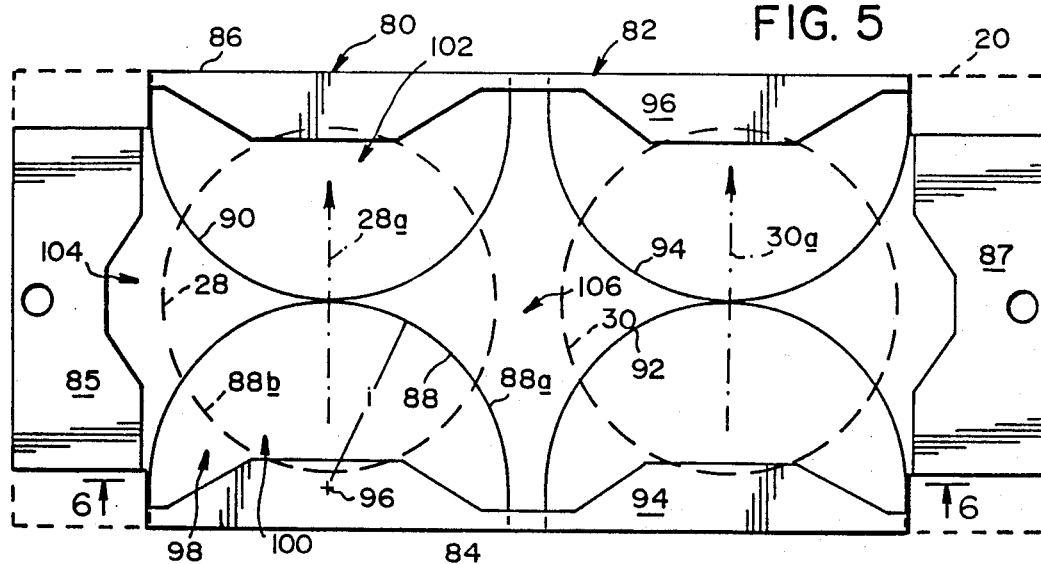
FIG. 5 is a plan view of a baffle constructed according to a second embodiment of the invention.

DETAILED DESCRIPTION OF THE INVENTION.

FIGS. 1 and 2 show, respectively, simplified front-on and side views of the sputtering station 14, in a multi-station sputtering apparatus or system 16. The system includes at least two sputtering stations, including a first station 17, seen in FIGS. 1 and 2, at which an underlayer is sputtered onto a substrate, and a second station, not shown, at which a magnetic thin film is deposited on the substrate. The basic sputtering system (without the baffle modifications described below) is preferably a commerically available system, such as is manufactured by Circuits Processing Apparatus (Fremont, CA), ULVAK (Japan), Leybald Heraeus (Germany), VAC-TEK (Boulder, CO). or Materials Research Corporation (Albany, NY). These systems are double-sided, in-line, high throughput machines having two interlocking chambers, for loading and unloading.

Sputtering station 17, which is representative, includes an upper target 20 having a target surface 22, and a lower target 24, whose target surface 26, confronts surface 22, as shown. Each target has a rectangular shape which is dimensioned to "cover" a pair of substrates such as substrates 28, 30, moving through the sputtering station. That is, with the substrates in the center of the sputtering station, as shown, the two substrates lie entirely above or below the two targets. In one sputtering system which will be illustrated herein, designed for use in producing one or more thin layers on a 5-¼ in. diameter substrate, the target has rectangular dimensions of about 16.5 in. by 7 in. The target is adapted for sputtering a pure metal or metal alloy material, and preferably pure chromium, by bonding a film of the metal material on the target backing. The rate of deposition is controlled conventionally, and is adjustable to vary the thickness of a layer being formed on the substrate, with such moving through the station at a given speed.

Substrates, such as substrates 28, 30, are supported in a side-by-side fashion seen in FIG. 1 on a pallet 32. Each substrate, such as substrate 28, is carried on the pallet in a recessed rim of an opening, such as the one shown at 34 in FIG. 1. The openings permit deposition of sputtered material from target 24 onto the lower faces of the two substrates.

Pallet 32 is mounted in the sputtering system for movement through the sputtering station, in a front-to-back direction, on a pair of tracks 36, 38, which extend through the one or more stations in the system. The two tracks may be electrically isolated to allow a desired voltage potential to be placed on the substrates through the pallets, which are preferably formed on conductive material. The pallet is positioned within the sputtering station on tracks 36, 38, to place the upper and lower surfaces approximately equal distances from the sputtering surfaces of the upper and lower targets, respectively, so that thin-film deposition is symmetrical with respect to the two surface planes of each substrate.

A conventional chain drive is operable to move pallet 32 (and a succession of substrate-carrying pallets) through the one or more sputtering stations in the system, in a front-to-back direction (left-to-right in FIG. 2. The chain drive, which is also referred to herein as moving means, is indicated by arrow 40 in FIG. 2, which indicates the direction of pallet movement. The pallets are moved typically at a rate of between about 5–100 cm/min.

Also shown in the FIGS. 1 and 2 are identical baffles 42, 44 which are constructed to effect substantially symmetrical deposition of target material onto the substrate, in accordance with the invention. The two baffles replace the usual rectangular metal frames found in commercial sputtering systems of the types under discussion, and are bolted on the targets in the same manner that conventional frames are.

Baffles 42, which is representative, will be described with particular reference to FIGS. 3 and 4. The baffle includes a generally rectangular frame 46, having notched corners, such as corner 47, seen in FIG. 3. The frame has substantially the same rectangular dimensions as the target, whose square corners are seen in dashed lines at 20 in FIG. 3. In the system where the target has the above-mentioned planar dimensions of about 16.5 times 7 in., the baffle has the approximate dimensions, identified by the designated arrows, as follows: a=2.1 in., b=12.5 in., c=0.9 in., and d=5.25 in. The target and baffle having the dimensions noted are designed for use in sputtering on a 5-¼ in. or smaller-diameter substrates. The target and baffle dimensions can be increased, in a roughly proportional manner, to accommodate sputtering onto larger substrates.

The baffle frame is composed of front and back shields, or frame members 48, 50, respectively, each having the outer notched or stepped regions forming the frame notches, such as notch 47 seen in FIG. 3. The front and back frame members are joined, as by welding, at their side edges by a pair of side frame members, 52, 54, to form the rigid frame structure. The width of the frame in the embodiment under consideration is about 2.2 in. With the baffles placed operationally on the respective targets, the distance between the substrate and the lower edge of the baffle is about 0.5 in.

The baffle includes three strips, 56, 58, 60, extending between the front and back frame members (FIG. 3), and attached thereto as by welding. The central strip is disposed midway between the sides of the baffle and therefore extends along the front-to-back center line of the associated target, with the baffle placed operationally on the target. Each of the other two strips is positioned, with respect to the center strip, an equal distance from the center-line path of travel of the associated substrate; that is, strips 56 and 58 are equidistant from the center-line path of travel of substrate 28, indicated by dash-dot line 28a in FIG. 3, and strips 58, 60 are equidistant from the center-line path of travel of substrate 30, indicated by dash-dot line 30a. Stips 56, 58, in conjunction with adjoining portions of frame members 48, 50, define a substantially square window 61 in which the entire substrate (shown in dashed lines in 28) can be viewed, when the substrate is positioned centrally with respect to the baffle as indicated. Similarly, strips 58, 60 form with adjoining portions of frame members 48 and 50, a second substantially square window 63 through which the entire region of the side-adjacent substrate, shown by dashed line 30, can be viewed.

The width of the strips is selected to produce a desired amount of shielding of target material being sputtered in side-to-side directions (right/left directions in FIGS. 1 and 3) as will be detailed below. Generally, where greater crystal isotropy is desired in the sputtered layer, the selected strip width will be greater, to insure more symmetrical deposition of sputtered material onto the substrate and to effect greater shielding of low-angle material. In the particular baffle under discussion, having a frame width of about 2.2 in., the strip thickness indicated, by arrow f in FIG. 4, is between about 0.5–1.5 in. The strips are positioned about midway between the top and bottom edges of the frame as shown.

Looking at FIG. 3, the baffle further includes front and back shield plates 62, 64, respectively, which are attached, as by welding, to the lower edge regions of members 48, 50, respectively. Each plate is fashioned, as shown, to form a pair of side-by-side trapezoidal projections, such as projection 66 in plate 62 and confronting projection 68 in plate 64. The plate projections are tapered, moving radially outwardly away from a central region of the corresponding baffle window, to provide progressively less shielding between the target and the substrate, on moving radially outwardly toward opposite side regions of the substrate. The dimensions of each projection., indicated by the arrows f, g, and h are 2.5, 1.25, and 0.75 in., respectively, in the baffle under consideration.

Completing the description of baffle 42, the reduced-width left and right end portions of the baffle are covered at their lower edges by end plates 72, 74, respectively. The plates are attached to the adjoining lower edges of the baffle, as by welding. The plates are notched, as indicated, to a preferred depth of 0.25 in. in the instant embodiment. The central hole in each plate is used in fastening the baffle to the target. Baffle 42, including the four frame members, strips 56, 58 and 60, the two shield plates and end plates 72, 74, are preferably formed of sheet metal, such as stainless steel, with preferred thickness of between about 0.05 and 0.1 in.

Figure 6:
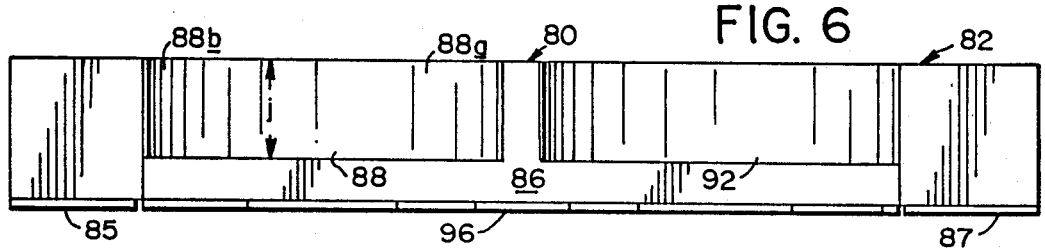
FIG. 6 is a sectional view taken generally along line 6—6 in FIG. 5.

FIGS. 5 and 6 illustrate, in plan and side-sectional views, respectively, a second type of baffle 80 which is effective in practicing the method of the invention. The baffle includes a frame 82 which is substantially identical to frame 46 in baffle 42. The frame'front and back frame members 84, 86, respectively, form front and back shields which act to limit deposition of sputtered target material to substrate regions directly underlying the target, as will be seen. The reduced-width end portions of the baffle are provided with end plates 85, 87, similar to plates 72, 74 in baffle 42, and are attached, as by welding, to associated lower edge portions of the frame.

The baffle contains four curved members 88, 90, 92, 94, disposed within the frame as shown in FIG. 5. Each member is attached, as by welding, to the associated inner face of the front or back frame member, and confronting curved members are attached to one another, also as by welding, at their point of connection midway between the front and back frame members. In a frame having the same dimensions of those of above-described frame 46, each of the curved members has a radius of curvature, indicated by arrow i in FIG. 5, of about 2.9 in. The center of the semi-circle formed by each member is indicated by a cross, such as the one at 96 in strip 88. The drawing also shows, in dashed lines, the outline of a pair of substrates 28, 30 which are centered directly below a target to which the baffle is attached, and in dash-dot lines at 28a and 30b, respectively, the center-line paths of travel of the two substrates through a sputtering station. As seen, each path of travel intersects the centers of the confronting curved members in the corresponding baffle region. As seen in FIG. 6, the upper edges of the looped members are flush with the upper edges of the frame, and extend a distance indicated by arrow j below the upper edges of the frame. The width j of the members is about 1.5 in. in a baffle whose frame width is about 2.2 in.

Each curved member, such as member 88, may be thought of as comparing a pair of quarter-circle baffle strips, such as strips 88a and 88b in strip 88. As can be appreciated with reference to FIG. 5, the two strips in each member 88, 92 are positioned symmetrically above opposite sides of a substrate, with such underlying a front portion of the target. The strips are adapted to produce substantially symmetrical sputtering from target side directions during early phases of layer deposition on each substrate, as will be described below.

The baffle further includes a pair of shield plates 94, 96 attached, as by welding, to the lower edges of the frame's front and back members, respectively. Each plate is fashioned, as shown, to form a pair of side-by-side trapezoidal projections having substantially the same dimensions as the above-descirbed projections in baffle 42. As can be appreciated from FIG. 5, the exposed portion of each curved member—that is, the portion extending beyond the associated trapezoidal projection—defines a substantially semi-circular window, through which about half of a substrate can be viewed, when positioned in either the front or back region of the associated target. The semi-circular window formed by member 88 is indicated at 98 in FIG. 5. The baffle having the particular dimensions just described is adapted for use in sputtering onto a pair of substrates with diameters of about 5.25 in. or less. For substrates substantially larger than 5.25 in., both target and baffle dimensions can be scaled up roughly proportionately, as with baffle 42.

Figure 7:
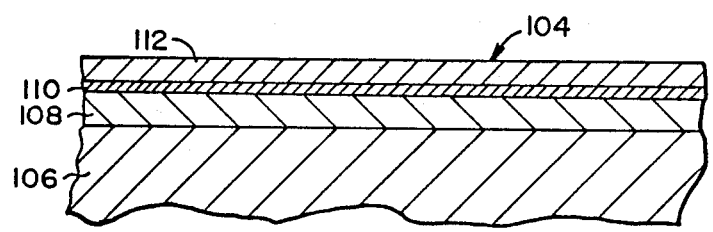
FIG. 7 is a sectional view of a surface portion of a magnetic recording medium formed in accordance with the invention.

The method of the invention for producing a high-performance magnetic recording medium will now be described. A fragmentary surface region of such medium, or disk, is shown sectionally at 104 in FIG. 7. The disk generally includes a substrate 106, and, forming successive thin-film layers over the substrate, a chromium underlying 108, a magnetic thin film 110, and a protective coating 112. It is understood that FIG. 7 illustrates only one of the two recording sides of disk 104, the "lower" magnetic recording surface having substantially the same construction as the upper recording surface. Although the sputtering steps will be described only with reference to events occurring on the upper substrate surface, it is recognized that substantially identical deposition events are occurring at the same time on the substrate's lower surface. In particular, the reference to a substrate as positioned "below" its target refers to the sputtering events occurring at the upper substrate surface, it being understood that the lower substrate surface is, at the same time, positioned above its target.

The disk is preferably produced in accordance with the invention in a sputtering system having four stations—an initial heating station at which substrate heating occurs, and three sputtering stations where the underlayer, magnetic thin film and outer coating are formed successively on the substrate. The substrate used in forming the disk is a conventional rigid aluminum alloy substrate of the type used commonly in digital recording disks for read/write recording by a flying head which flies close to the recording surface. Rigid aluminum disks coated with a suitable surface alloy can be obtained from Poly Disk, Inc. (Los Angeles, CA) and Knudsen Systems, Inc. (Chino, CA).

The substrate, which is loaded in the system in a side-by-side arrangement on a two-substrate pallet, as described above, is moved initially into a heating station to heat the substrate to a desired surface temperature. Typically a heating source setting of 2.5 kw (on each side of the pallet) is employed.

The heated substrate is then moved toward the first sputtering station at which the chromium underlayer is to be formed. The target in the sputtering station is equipped for sputtering chromium at a preferred target power of between about 0.8 and 4 kw. With reference to FIGS. 2 and 3, it can be appreciated that as the substrate approaches the front of the sputtering station (from the right in FIG. 2) the front frame member, or shield 48 in baffle 42, acts to limit deposition onto the substrate to substrate regions which directly underlie the target, i.e., low-angle deposition from the target onto approaching substrate regions outside of the target area is effectively shielded. This insures that the substrate does not see asymmetrical low-angle deposition in back-to-front directions, in the absence of direct overhead deposition.

Also during the early phases of crystal growth on the substrate, central strip 58 acts to shield each substrate from material which would otherwise be sputtered at low angles from the opposite side of the target. On each side of the target, such as the left target side in FIG. 3, the central strip and the associated side strip, such as strip 56, are positioned symmetrically on the opposite sides of the center-line path of the substrate, which is moved below that side of the target. Each side strip, such as strip 56, functions to limit low-angle deposition from the associated reduced-width end region of the target such that side-directed sputtering onto the substrate is substantially symmetrical with respect to the path of the substrate. Also, as can be appreciated, the two strips provide substantially unhindered deposition onto the substrate from the target region directly overlying the substrate. That is, ther is no shielding between the target and the regions of the substrate which underlie the target.

The initial layer formation events just described include formation of isolated crystal nuclei, growth of the isolated crystals, referred to as "island formation", and finally coalescence of the crystallites to form a continuous crystal layer. The thickness of the coalesced crystalline layer is typically about 200 Å and is formed, under usual sputtering conditions, in the first 10–25% of travel of the substrate through the sputtering station. This region, where the just-described early phases of crystal layer formation occur, is also referred to herein as the front, or upstream, deposition region, and underlies an upstream portion of the target.

Because of the degree of deposition angle symmetry and the need to limit low-angle deposition is greatest in the front deposition region, the baffle strips, and particularly the center baffle strip is preferably wide enough to block out substantially all deposition onto a substrate from the opposite side of the target. In a baffle having the dimensions mentioned above, strips 56, 58 and 60 are preferably about 1.5 in. wide.

Once the coalesced crystalline layer has formed on the substrate, continuing deposition may occur with less symmetrical sputtering without significantly disturbing the already-established crystal orientation directions formed in the front deposition region. In these layer and final stages of deposition, which occur at the substrate passes through a back or downstream deposition region, the baffle acts principally to limit sputtering to angles which are substantially no less in magnitude than those seen by the substrate in the front sputtering region. In baffle 40, this function is accomplished primarily by center strip 58, which limits asymmetrical, low-angle deposition from opposite sides of the target. Also asymmetrical, low-angle deposition is limited by back shield 50 which acts to prevent sputtering onto target regions which do not directly underlie the target as the substrate is being moved out of the target area. The rate of movement of substrate through the first sputtering station and the rate of sputtering from the target are controlled to produce a final chromium underlayer thickness between about 1,000 and 4,000 Å, and preferably between about 1,000 and 2,000 Å. The sputtering angles allowed by the baffle are such that the crystal isotropy of the coalesced crystal layer (formed in the upstream deposition region) is substantially preserved.

The functioning of baffle 80 illustrates how a baffle with a quite different configuration functions in producing a substantially isotropic sputtered underlayer, in accordance with the method of the invention. It is noted first that the early phases of layer formation—up to the coalesced crystallite stage—occur within each of the front curved members. As a substrate is moved into the sputtering station, front shield 84 in the baffle acts to limit deposition to substrate regions which directly underlie the target. At the same time, front/back deposition within each front curved member is limited to a relatively narrow range of angles allowed by the radius of the curved member. The two strips making up each curved member, such as strips 88A and 88B, in member 88, act to limit side-directed deposition to symmetrical angles which are generally greater than the side-directed deposition angles allowed in baffle 42, due to the narrowing distance between the strips on moving rearward.

As the substrate moves from the semi-circular region defined by curved member 88, deposition angles are limited in a side-to-side direction, by curved member 90, whose two quarter-circle portions form rear extensions of baffle strips 88a, 88b in member 88. That is, members 88, 90 collectively form a pair of strips which extend in a generally front-to-back direction between the front and back shields in the baffle. Also limiting asymmetrical, low-angle deposition on the substrate is back shield 86, which acts to prevent sputtering onto target regions which do not directly underlie the back region of the target. It can be appreciated from FIG. 5, that deposition of material onto the substrate is substantially symmetric in a side-to-side direction, and substantially unhindered (unshielded) when the substrate is either halfway into or halfway out of the region directly underlying the target. As defined herein, sputtering deposition is substantially unhindered, in a side-to-side direction, if it is substantially unhindered over the entire region of the substrate underlying the target, as in the FIG. 3 embodiment, or it is substantially unhindered over front and back halves of the substrate underlying the target as the substrate passes through the sputtering region.

Following formation of the isotropic crystalline underlayer, the substrate is moved into and through the second sputtering station where the magnetic thin-film is deposited on the substrate. According to one aspect of the invention, it has been discovered that exceptional coercivity magnetic remanence, and loop squareness properties can be achieved in a thin-film composed of cobalt, nickel, and chromium, in a weight ratio of between about 70–88% cobalt, 10–28% nickel, and 2–10% chromium, and preferably between about 74–78% cobalt, 15–25% nickel, and 5–10% chromium.

During movement of the substrate through the second sputtering station, the alloy material is sputtered at deposition angles which substantially preserve the isotropic crystalline character of the underlayer. This is done, as in the first sputtering station, by shielding the substrate from low-angle, asymmetric deposition angles. The shielding function can be performed by a baffle having the general features of the baffle 42 or 80, i.e., front and back shields which limit deposition to regions which substantially underlie the target, and one or more strips extending between the front and back shield, to limit small-angle asymmetric deposition from one side of the target onto substrate regions which underlie the other side of the target. As indicated above, once the initial coalesced portion of the underlayer is formed, asymmetric and/or low-angle deposition is less critical to achieving crystal isotropy, and greater latitude in deposition angles is allowed. Thus, for example, the center strip in baffle 42 need not shield against sputtering from opposite sides of the target to the same degree that is required during initial underlayer formation.

According to another aspect of the invention, film deposition region, in a manner that provides progressively less shielding between the target and substrate, on moving outwardly away from the path of travel of the substrate, toward opposite side regions of the substrate. Such shielding is intended to offset the greater concentration of material which is deposited in the center-line region of the substrate along the path of the substrate travel. It can be seen in FIG. 3, for example, that strip 58 and associated side strips 56, 60 effectively divide the target into two square windows, each bisected in a front-to-back direction by the path of travel of the underlying substrate. Absent any additional shielding, the greatest amount of deposition would occur along this path of travel, and decrease progressively on moving toward the opposite sides of the substrate. Similarly, from FIG. 6 it can be appreciated how greatest material deposition would occur along each substrate path of travel, absent compensatory shielding. as can be appreciated in these two figures, the shielding projections in each baffle 42 or 80 functions to reduce deposition along a center strip containing the substrate path or travel, and allow progressively more shielding on moving away from the center strip. The rate of sputtering in the second target, and the rate of transport of the substrate through the target is such as to produce a final film thickness of between about 300 and 1,000 Å, and preferably about 400–600 Å.

As a final step in disk construction, the substrate may be further treated to form a hard protective coating over the thin film. The coating may be readily formed by sputtering a layer of carbon over the substrate in a third sputtering station.

Figure 9:
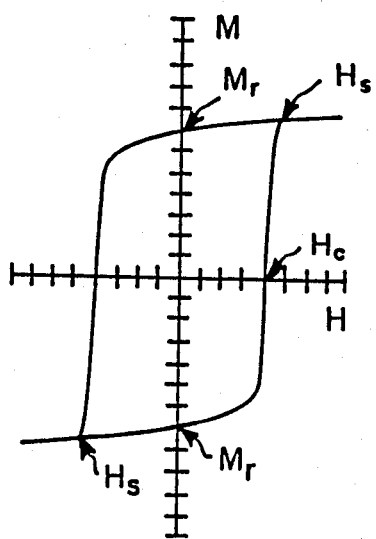
FIG. 9 shows the M-H hysteresis-loop of an exemplary disk produced in accordance with the invention.

The opertional characteristics of the magnetic medium produced in accordance with the invention will be considered. FIG. 9 shows the M-H curve for an exemplary disk, designated 0611-1-1RFB, having an approximately 1500 Å chromium orienting layer and an approximately 570 Å film composed of 75% cobalt, 18% nickel, and 7% chromium. Magnetic field values H are expressed in Oersteds; $H_c$ and $H_s$ values are determined directly from the M-H plot (each H-axis line marking in FIG. 4 represents $2 \times 10^2$ Oersteds). Remanence values are expressed as $M^r$·t values were calculated by driving $M_r$, determined from the M-H plot (each M-axis line marking in FIG. 4 represents $4 \times 10^{-3}$ EMU) by the examined area of the medium, expressed in cm².

Similar M-H hysteresis-loop measurement were performed on two other exemplary disk, designated 0613-1-1RCIA and 0613-2-1-LCIA, these disks differing from the above 1RFB disk only in the thickness (t) of the magnetic film, as indicated in Table I below. Measured values of remanence ($M_r$·t), coercivity ($H_c$), and saturating magnetic field ($H_s$) are shown for the exemplary disks in Table I. As seen, all three disks have remanence values above $3 \times 10^{-3}$ EMU/cm², and coercivity values of greater than 800 Oersteds. As expected, greater coercivity and smaller remanence values were observed for thinner magnetic films.

The $H_c/H_s$ ratio was calculated for each disk from the corresponding $H_c$ and $H_s$ values in the table. The ratios given in Table I show a loop squareness factor of greater than about 0.9 for each disk.

The data in the final column in Table I are calculated values of $M_r/H_c$, a demagnetiazation parameter which provides a measure of the recording density of the medium. The value is calculated for each disk from the corresponding $M_r$·t and $H_c$ values given in Table I. The smaller values seen for the thinner magnetic films indicate higher information storage density. More direct measures of information bit density, based on signal amplitude and resolution characteristics, are discussed below.

TABLE 1

| disk | t (Å) | $M_r$·t (EMU/cm²) | $H_c$ ($O_e$) | $H_s$ ($O_e$) | $H_c/H_s$ | $M_r$·t/$H_c$ (Å) |
|---|---|---|---|---|---|---|
| 1RFB | 570 | $6.2 \times 10^{-3}$ | 800 | 840 | 0.95 | 787 |
| 1RC1A | 480 | $5.3 \times 10^{-3}$ | 946 | 1050 | 0.9 | 559 |
| 1LC1A | 360 | $3.9 \times 10^{-3}$ | 966 | 1070 | 0.9 | 406 |

Figure 10:
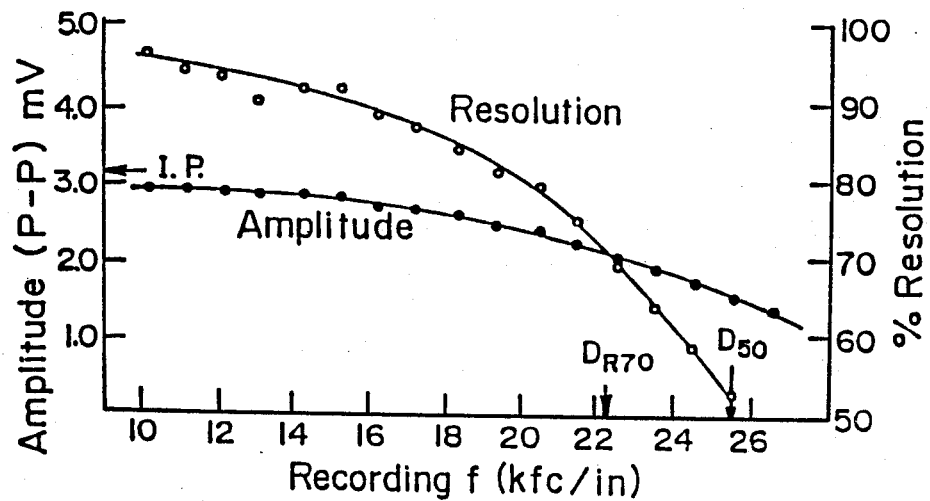
FIG. 10 is a graph of amplitude and resolution characteristics, as a function of recording density, measured for an exemplary disk.

FIG. 10 shows a plot of signal resolution and signal amplitude, as a function of recording frequency, for the 0613-1-1RClA exemplary disk characterized above. The amplitude and resolution measurements were performed using a 3350 manganese/zinc thin-film flying head obtained from Magnebit Corporation (San Diego, CA), having an inductance of 19 μH, a 35 microinch gap, and a 0.002 inch track width. The head was operated at a 45 mA (peak-to-peak) write current, and at a spacing of 8 microinches from the disk. The disk was rotated at 3,600 rpm and the measurements were performed at a radius of 1.3 inches.

Signal amplitude, shown as the upper curve in the graph, was determined from peak-to-peak amplitude, measured in millivolts, as indicated at the left in the graph. The amplitude of an isolated pulse (I.P.), measured from a single pulse recorded on the disk, was slightly greater than 3 millivolts, as indicated. The signal amplitude at a recordng frequency (density) of 10 kiloflux changes/inch (kfc/in) was about 2.9 millivolts, and this value fell gradually, as shown, at higher frequencies. The recording frequency at which the amplitude dropped to about 1.5 mV—50% from its isolated pulse amplitude—in indicated at $d_{50}$ in FIG. 10 and has a value, at the above recording conditions, of about 25.5 kfc/in. This value indicates that the disk is capable of carrying 25.5 kilobits of information/inch at a 50% maximum signal level.

The lower curve in FIG. 10 measures signal resolution in the disk as a function of recording frequency. Experimentally, a first signal is written at one recording frequency, and the recording signal amplitude is determined. The disk is then rewritten with a second signal recording at twice the first-signal frequency, and the recorded amplitude is again measured. The ratio of the second signal amplitude to first signal amplitude defines the disk resolution, here expressed as a percentage. As seen from the figure, the resolution drops from about 96% at a recording frequency of 10 kiloflux changes-/inch to about 53% at 25.5 kfc/in. The recording frequency designated $D_{R70}$, here about 22.2 kfc/in, is the recording frequency at which 70% resolution is achieved. This value, expressed in kilobits/inch, represents another measure of the information storage density of the disk.

To measure disk writability, the first signal was written on the disk under the conditions described above, at a selected frequency, e.g., 1,000 kfc/in, and a second signal at a higher frequency was then written directly over the first one, without erasing. The residual value of the first signal is then determined. The ratio of this residual value to the original signal amplitude (at the first frequency) is a measure of the signal residuum which remains after overwriting the disk. The calculated value is expressed in decibels in Table II below. The −36 dB overwrite value indicates good writability in the disk.

Table II below status shows isolated pulse amplitude values (I.P.), $D_{50}$ and $D_{R70}$ recording frequencies, $D_{R70}$ amplitude, and overwrite (OW) values for the 1RClA disk, as measured above. Similar measurement for the other two exemlary disks, performed with the same head and substantially under the same recording conditions, are also shown in the Table II. A comparison of the Table II data with that in Table I shows the generally inverse relationship between isolated pulse amlitude (related to remanence) and coercivity, the higher coercivity in the thinner films being associated with lower isolated pulse amplitude values. All of the disks have an information storage density, under the recording conditions employed, of greater than about 21,000 bits/inch at 50% isolated pulse amplitude, and greater than about 19,000 bits/inch at 70% resolution. Overwrite values of −36 dB or less were obtained.

TABLE II

| disk | IP (mV) | $D_{50}$ (kfc/in) | $D_{R70}$ (kfc/in) | Amp/$D_{R70}$ (mV) | OW (−dB) |
| --- | --- | --- | --- | --- | --- |
| 1RFB | 4.52 | 21.8 | 19.4 | 3.02 | 36 |
| 1RC1A | 3.08 | 25.5 | 22.2 | 2.1 | 38 |
| 1LC1A | 3.42 | 26.2 | 22.9 | 2.35 | 36 |

A similar set of data for the same three exemplary disks was generated using a 3350 magnesium/zinc thin-film flying head having an inductance of 8.7 μH, a 35 microinch gap, and 0.002 inch track width. the head was operated at either a 60 or 70 mA peak-to-peak write current and at a space of 15.5 microinch from the disk. The disk rotation and radius were as in the Table II measurements. The data are shown in Table II below.

TABLE III

| disk | IP (mV) | $D_{50}$ (kfc/in) | $D_{R70}$ (kfc/in) | Amp/$D_{R70}$ (mV) | OW (−dB) |
| --- | --- | --- | --- | --- | --- |
| 1RFB | 1.94 | 15.7 | 13.3 | 1.29 | 32 |
| 1RC1A | 1.42 | 18.1 | 15.3 | 0.94 | 34 |
| 1LC1A | 1.226 | 20.5 | 16.3 | 0.85 | 36 |

The data indicate that, under the recording conditions used, the exemplary disks have a storage density of between 15,000 and 20,000 bits/inch (at $D_{50}$). Similar high performance characteristics were measured in the three exemplary disks using a magnesium/zinc mini-mono head having an inductance of 12 μH, a 35 microinch gap, and a 0.0007 inch track width, where the head was operated at 40 or 45 mA peak-to-peak and at a spacing of 15 microinches.

As seen above, the disk of the invention combines high coercivity and high remanence, giving excellent signal and information storage characteristics. According to one aspect of the invention, coercivity in the disk is increased substantially by the selected alloy composition used in forming the magnetic film, as will now be discussed. To assess the effect of the alloy composition on disk coercivity, disks having magnetic thin films composed of either cobalt/chromium (88/12 weight percent), cobalt/nickel (80/20 weight percent), or cobalt/nickel/chromium (75/18/7 weight percent) were prepared, substantially according to the production method described above. Briefly, the disks were each formed with a chromium orienting layer, sputtered to a thickness of about 1500 Å, and a magnetic recording film, sputtered to a thickness of about 400–500 Å. $M_r \cdot t$ and intrinsic coercivity values for each disk were measured from M-H hysteresis-loop curves, as detailed above. $M_r \cdot t$ values were about $4.0 \times 10^{-3}$ EMU/cm$^2$ for all three alloys. The coercivity values obtained were: cobalt/chromium, 500 Oersteds; cobalt/nickel, 650 Oersteds; and cobalt/nickel/chromium, 950 Oersteds. As can be appreciated, the alloy composition used in forming the disk of the invention increased coercivity nearly twofold over that obtainable with binary cobalt/chromium used commonly in the prior art.

Angular variations in peak-to-peak recording signal amplitude, which measure film thickness uniformly and the degree of crystal isotropy in the disk, were also examined. The measurements were made using a Media Test Specialists certifier, operated in a conventional mode. The disk was rotated at 3600 rpm, and measurements were performed at an inner-track radius of 1.2 inches, and at an outer-track of 2.4 inches.

Figure 8A:
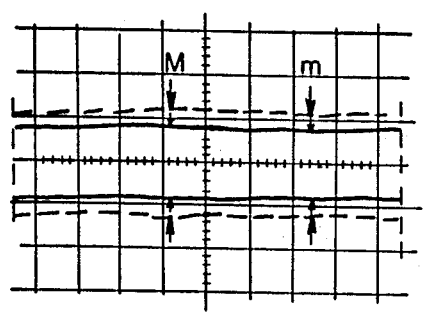
FIG. 8A shows variations in peak-to-peak recording signal amplitude, as a function of angular disk positions, at inner diameter (solid lines) and outer diameter (dotted lines) recording tracks, in a magnetic recording medium constructed in accordance with the invention.

The inner-track peak-to-peak signal amplitude, recorded as a track on an oscilloscope, is shown by the inner solid lines in FIG. 8A. The maximum peak-to-peak signal amplitude, measured at the position indicated at M in the figure, is about 10% higher than the minimum peak-to-peak amplitude arrow measured at position indicated at m. The outer envelope, shown in dashed lines in the figure, shows the peak-to-peak signal frequency measured over the disk at the outermast track. Again, there was only about a 10% difference between the maximum and minimum peak-to-peak amplitude measurements, as measured at the angular positions on the disk indicated by M and m.

Figure 8B:
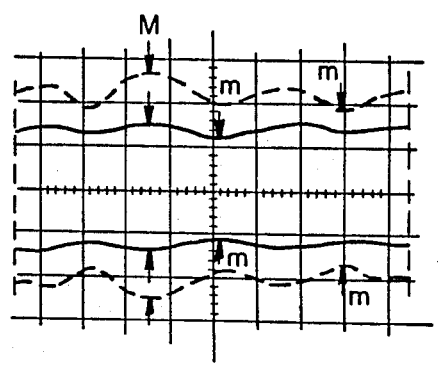
FIG. 8B is a view like FIG. 8A, showing variations in recording signal amplitude in a disk formed by conventional sputtering methods.

For comparative purposes, similar measurements on the angular variations of peak-to-peak signal amplitude were measured in a disk formed according to the general procedures described above, except where the underlayer and magnetic thin film were deposited under conventional sputtering-target baffle conditions, i.e., under conditions of low-angle asymmetrical sputtering and film-thickness variation which characterize deposition in a sputtering system in which the baffles described herein are replaced by conventional rectangular frames. The results of the signal amplitude measurements, which are performed substantially as described above, are shown in FIG. 8B. As in FIG. 8A, the envelopes of solid and dashed lines represent peak-to-peak signal amplitude variations over the surface of the disk measured at inner and outer track positions, respectively. The signal traces seen in FIG. 8B differ from those in FIG. 8A in two important respects. First, there is a substantial angular variation in peak-to-peak signal amplitude, particularly at the outer recording track. As measured at the positions indicated by arrows M and m, where maximum and minimum peak-to-peak signal levels were determined, the innermost track showed a variation of about 25%, and the outermost track showed a variation of about 40%. Secondly, the signal variation seen in the second disk, (formed under relatively anisotropic sputtering conditions) shows a periodic variation in signal amplitude, particularly at the outermost recording track. This periodic variation would be expected for a thin-film medium formed under sputtering conditions in which the symmetry of side-to-side deposition was substantially different than front-to-back deposition.

From the foregoing, it can be appreciated how various objects and features of the invention are met. The method of the invention allows for the production of magnetic recording medium having high magnetic remanence, coercivity and loop squareness ratio characteristics related to the underlayer and magnetic thin-film compositons of the disk, and these characteristics, as reflected in peak-to-peak recording signal amplitude, are substantially uniform over the surface of the disk at both inner and outer recording tracks.

According to another advantage of the invention, the disk can be produced in a high-throughput sputtering system whose operation can be controlled, with high reproducibility, to achieve isotropic, uniform-thickness deposition layers of selected thicknesses. Quality control tests over a several month period on a group of disks manufactured according to the method described herein indicate that, in the absence of dust contamination, essentially all of the disks meet the stringent performance specifications which were tested.

Magnetic disks produced in accordance with the present invention have been compared in performance characteristics with magnetic 5¼" disks available from several other commercial sources. One performance study, carried out by a major disk drive manufacturer, compared disks made by the present invention (Vendor 6) with disks supplied by five other vendors (Vendors 1–5). The tests were carried out using a mini-monolithic 3370-type test head, 0.850 mil track width, 35 μinch gap, and a 13 μinch fly height at the inner diameter. The data rate was 7.5 megabits/sec, and the spindle speed, 3600 rpm. The disks were compared for percent resolution at both inner and outer diameters, inner diameters signal-to-noise ratio, inner diameter pulse-width signal-to-noise ratio, and inner diameter pulse-width at half amplitude (Pw50) measured in nanoseconds. Two disks from each vendor were tested. The test results are shown in Table IV below.

TABLE IV

| Vendor | Disk No. | Res (%) OD | Res (%) ID | S/N(db) ID | Pw50(ns) ID |
|---|---|---|---|---|---|
| 1 | 1 | 87 | 77 | 48 | 142 |
|   | 2 | 90 | 77 | 49 | 139 |
| 2 | 1 | 84 | 68 | 47 | 154 |
|   | 2 | 88 | 70 | 43 | 155 |
| 3 | 1 | 88 | 79 | 44 | 133 |
|   | 2 | 88 | 75 | 45 | 141 |
| 4 | 1 | 88 | 73 | 42 | 141 |
|   | 2 | 89 | 72 | 44 | 140 |
| 5 | 1 | 88 | 67 | 49 | 144 |
|   | 2 | 87 | 68 | 49 | 151 |
| 6 | 1 | 92 | 83 | 57 | 126 |
|   | 2 | 88 | 84 | 55 | 122 |

As seen, the disk of the present invention (made by Vendor 6) has higher resolution characteristics, particularly at the inner diameter, a significantly better signal-to-noise ratio, and a sharper pulse width signal than any of the other commercial disks tested.

FIG. 11 shows the results of testing by a disk media manufacturer (not the manufacturer of the present invention), to compare amplitude/resolution characteristics of a number of commercially available 5¼" media, including the disk produced in accordance with the present invention. The six disk manufacturers are identified by number, with media numbers 2, 5, and 6 (produced according to the present invention) being the same as in Table IV. The data measures inner diameter resolution at a given frequency as a function of outer diameter amplitude. The target plot shows a calculated theoretical maximum, and is normalized to provide an inner diameter resolution value of 100 at an outer diameter amplitude value of 100. The actual test data are plotted in relation to the target values. All of the media show the expected inverse relationship between amplitude and resolution. Of the six media tested, including three media not shown in Table IV, the disk formed according to the present invention (#6) most closely attained theoretical maximum performance values.

While the invention has been described with reference to particular and preferred embodiments, it will be appreciated that various changes and modifications can be made without departing from the invention.

It is claimed:

1. A method of producing a magnetic disk having a substantially isotropic, uniform-thickness magnetic film, said method comprising placing a planar circular substrate on a pallet for movement, linearly and without rotation, along a path through a sputtering chamber having a first target adapted to sputter a crystalline underlayer onto the substrate, and a second, downstream, target adapted to sputter the magnetic film onto the underlayer, moving the substrate through a first region underlying the first target, under shielding conditions provided by a fixed-position baffle which (a) limit deposition of sputtered material onto the substrate to substrate regions which substantially underlie the target and (b) provide substantially symmetrical, substantially unhindered side-to-side deposition onto the substrate, and moving the substrate through a second region underlying the second target under shielding conditions provided by a fixed-position baffle which (a) provide substantially symmetrical, substantially unhindered side-to-side deposition onto the substrate, and (b) provide less shielding between the target and substrate, on progressing radially outwardly away from a center region of the substrate paralleling the path of travel, toward opposite side regions of the substrate.

2. The method of claim 1, wherein the two targets each have left and right side regions dimensioned to overlie left and right substrates, respectively, which are moved through the corresponding target region in a side-to-side fashion, and the shielding conditions within each target restrict deposition of sputtered material from the left target side region onto the right substrate, and from the right target region onto the left substrate.

3. The method of claim 1, wherein the shielding conditions in the second target region are provided by a structure which includes a tapered projection extending in the direction of movement of the substrate.

4. The method of claim 1, for producing a magnetic disk having coercivity of at least about 700 Oersteds, a magnetic remanence of at least about $3 \times 10^{-3}$ EMU/cm$^2$, a loop squareness ratio of at least about 0.85, and characterized by fluctuations in peak-to-peak recording signal amplitude, over an entire circular recording path, of no more than about 15%, wherein the underlayer which is sputtered onto the substrate is a chromium underlayer having a thickness between about 1,000–4,000 Å, and the magnetic film which is sputtered onto the underlayer is an alloy containing between about 70–88% cobalt, 10–28% nickel, and 2–12% chromium, and having a thickness between about 300–1,000 Å.

* * * * *